US008944341B2

(12) United States Patent
Park et al.

(10) Patent No.: US 8,944,341 B2
(45) Date of Patent: Feb. 3, 2015

(54) DIFFUSER STRUCTURE AND MANUFACTURING METHOD THEREOF

(75) Inventors: Byung-jun Park, Taichung (TW); Jin-jong Su, Taichung (TW); Fang-yu Liu, Taichung (TW)

(73) Assignee: Global Material Science Co., Ltd., Wuci Township, Taichung County (TW)

( * ) Notice: Subject to any disclaimer, the term of this patent is extended or adjusted under 35 U.S.C. 154(b) by 805 days.

(21) Appl. No.: 12/762,335

(22) Filed: Apr. 18, 2010

(65) Prior Publication Data
US 2011/0111128 A1 May 12, 2011

(30) Foreign Application Priority Data

Nov. 9, 2009 (TW) .............................. 98137983 A

(51) Int. Cl.
*B05B 1/00* (2006.01)
*C23C 16/44* (2006.01)
*C23C 16/455* (2006.01)

(52) U.S. Cl.
CPC ....... *C23C 16/4404* (2013.01); *C23C 16/45565* (2013.01)
USPC ............... 239/1; 239/553; 239/590; 239/591; 239/601

(58) Field of Classification Search
USPC .......... 239/553–553.5, 556–558, 591, 1, 601; 118/723 DC
See application file for complete search history.

(56) References Cited

U.S. PATENT DOCUMENTS

| 6,633,623 | B2 * | 10/2003 | Dulka et al. | .................. 376/306 |
| 7,364,097 | B2 * | 4/2008 | Okuma | ......................... 239/530 |
| 2004/0129211 | A1 | 7/2004 | Blonigan et al. | |
| 2008/0178807 | A1 | 7/2008 | Wang et al. | |
| 2008/0230518 | A1 | 9/2008 | Brillhar et al. | |

FOREIGN PATENT DOCUMENTS

| KR | 10-2004-0063828 A | 7/2004 |
| TW | 200537561 A | 11/2005 |
| TW | M299917 U | 10/2006 |
| TW | 200844341 A | 11/2008 |

* cited by examiner

*Primary Examiner* — Christopher Kim
(74) *Attorney, Agent, or Firm* — Cheng-Ju Chiang

(57) ABSTRACT

A diffuser structure and a manufacturing method thereof are disclosed. The diffuser structure includes a substrate, a plurality of throughholes, and a glue layer. The throughholes are perpendicularly formed in the substrate. Each throughhole includes a gas-in part, a gas-out part, and a connecting part for connecting the gas-in part to the gas-out part. The glue layer is formed on a side wall of each gas-out part, and a thickness of the glue layer is between 1 μm and 11 μm. The present invention can solve a problem that particles are periodically generated after a periodic self-cleaning function is implemented in a plasma-enhanced chemical vapor deposition system.

22 Claims, 5 Drawing Sheets

US 8,944,341 B2

DIFFUSER STRUCTURE AND MANUFACTURING METHOD THEREOF

BACKGROUND OF THE INVENTION

1. Field of the Invention

The present invention relates to a diffuser, and more particularly to a diffuser structure capable of preventing particles from being generated periodically in a plasma-enhanced chemical vapor deposition system, as well as a manufacturing method thereof.

2. Description of Prior Art

In a manufacturing process of a liquid crystal display device, a plurality of elements such as thin film transistors (TFTs) have to be manufactured on a glass substrate firstly. Please refer to FIG. 1, which illustrates the glass substrate 10 placed in a plasma-enhanced chemical vapor deposition (PECVD) reaction chamber 1. For composing the PECVD reaction chamber 1, a diffuser 12 is utilized as an upper electrode and a susceptor 14 is utilized as a lower electrode. The diffuser 12 comprises a plurality of throughholes (not shown) for gas or fluid to flow through. Plasma 16 is generated and filled between the diffuser 12 and the susceptor 14. When the chemical vapor deposition process is performed, required reaction gases are firstly conducted into the PECVD reaction chamber 1 through a gas inlet 18. Then, the reaction gases flow through a backing plate 20 and the throughholes (not shown) of the diffuser 12. Therefore, by manipulating a voltage difference applied between the diffuser 12 and the susceptor 14 and the effect of the plasma 16, desired films can be formed on the glass substrate 10 for manufacturing the elements. Finally, waste gases generated by the aforesaid manufacturing process are exhausted through a gas outlet 22.

However, the by-products left by the manufacturing process such as SiNx, amorphous silicon, polycrystalline silicon, SiOx, P—Si, and N—Si, are deposited on side walls of the throughholes (not shown) of the diffuser 12. When a film formed by these by-products is insufficiently stabilized, particles originated from these by-products will drop onto the glass substrate 10 and then adhere thereon. Once the aforesaid particles are too big or the particles are too much to drop onto the glass substrate 10, defects of the elements on the glass substrate 10 happen. This will lead to a bad performance of products of utilizing such glass substrate 10.

To solve the foregoing problem, a method of the prior art is to perform a periodic self-cleaning function for the PECVD reaction chamber 1 to remove the by-products deposited in the whole PECVD reaction chamber 1 for maintenance. The definition of such periodic self-cleaning function is that the deposited by-products are cleaned once after specific amounts of the glass substrates are processed. For example, the periodic self-cleaning function can be executed once for every 6 pieces of the glass substrates. In practice, a period of the periodic self-cleaning function can be executed between every 4 pieces and every 10 pieces.

Although the periodic self-cleaning function can solve the problem of the deposited by-products, a new problem may occur. In the beginning, the throughholes (not shown) of the diffuser 12 are formed by machining. Accordingly, the surface roughness of each side wall of the throughholes (not shown) is equivalent and the surface of each side wall is smooth. After the chemical vapor deposition process and the periodic self-cleaning function have been executed for some time, the surface roughness of each side wall of the throughholes (not shown) will increase. Then, when the periodic self-cleaning function is executed again, the particles will be formed on the surface of one of the glass substrates in the next processing period. For example, the periodic self-cleaning function is executed once for every 6 pieces of the glass substrates (Clean Count 1~Clean Count 6). When the diffuser 12 is new, the periodic self-cleaning function may not have problems. However, after the diffuser 12 has been utilized for some time, the surface roughness of each side wall of the throughholes (not shown) will increase.

Hereafter, described is the new problem caused by the periodic self-cleaning function. Assuming that the periodic self-cleaning function had been executed for N times and before the (N+1)-th time periodic self-cleaning function, the phenomenon that enormous amount of particles adhered on the surface of some piece among the 6 glass substrates. For example, the particles drop and are adhered on the surface of Clean Count 2 glass substrate. The root cause of the aforesaid phenomenon is that after Clean Count 1 glass substrate was processed, the by-products are adhered on the side walls of the throughholes and form by-product films. Then, during the process of the Clean Count 2 glass substrate, the by-products drop off and become the enormous amount of particles because the film stress of the by-product films on side walls of the throughholes keeps accumulated and then exceeds the critical point. Consequently, the by-product films peel and form the particles, and the particles drop and adhere on the surface of Clean Count 2 glass substrate. After that, Clean Count 3 glass substrate is processed, the by-product films with lower film stress have peeled and the particles have already dropped and adhered on the Clean Count 2 glass substrate. Therefore the particles issue does not happen to the Clean Count 3~Clean Count 6 glass substrates. In summary, as the surface roughness of each side wall of the throughholes (not shown) increases and the periodic self-cleaning function has been executed, the particles will be adhered on one specific glass substrate during the next self-cleaning period. To which glass substrate the particles issue happens depends on manufacturing processes and machine conditions of respective PECVD system.

Furthermore, it is noted that conditions of manufacturing processes of the PECVD reaction chambers provided by different manufacturers are different, thus the enormous amount of particles may not adhere to Clean Count 2 glass substrate specifically. The particles issue may happen to Clean Count 3 glass substrate or Clean Count 4 glass substrate, for example. However, the particles issue always happens to the same particular piece of Clean Count 1 glass substrate~Clean Count 6 glass substrate. That is, the particles are periodically generated on the same particular piece of Clean Count 1 glass substrate~Clean Count 6 glass substrate. This problem has been old and quite bothersome and annoying the entire industry field of LCD, but unable to be solved effectively for a long time. In such circumstance, as the size of the liquid crystal display panel is made larger and larger, the diffuser comes along with getting larger in size, and the cost of the diffuser is becoming more and more expensive as the same. The manufacturing cost must be too high if the diffuser has to be replaced once after executing every periodic self-cleaning function to solve the particles issue as a major option for the entire industry field of LCD.

Therefore, there is a need for developing a solution to the aforesaid problems that the particles are periodically generated after the surface roughness of side walls of the throughholes of the diffuser increases with executing the necessary periodic self-cleaning function.

SUMMARY OF THE INVENTION

A primary objective of the present invention is to provide a diffuser structure capable of improving the problem that particles are periodically generated and adhered on a glass substrate after executing a periodic self-cleaning function, as well as a manufacturing method thereof.

The diffuser structure according to the present invention comprises a substrate, a plurality of throughholes, and a glue layer. The throughholes are formed perpendicularly in the substrate. Each of the throughholes comprises a gas-in part, a gas-out part, and a connecting part for connecting the gas-in part to the gas-out part. The glue layer is formed on a side wall of each gas-out part, and a thickness of the glue layer is between 1 μm and 11 μm.

The manufacturing method of the diffuser structure according to the present invention, wherein the diffuser structure comprises a substrate and a plurality of throughholes formed perpendicularly in the substrate, each of the throughholes comprises a gas-in part, a gas-out part, and a connecting part for connecting the gas-in part and the gas-out part, the manufacturing method comprises steps of: cleaning the diffuser structure by using a chemical solution; and forming a glue layer on a side wall of each gas-out part, wherein a thickness of the glue layer is between 1 μm and 11 μm.

The glue layer of the present invention is capable of decreasing shrinkage stress on the surface of each gas-out part when a film is formed by the by-products in the manufacturing process. As a result, the shrinkage stress on the surface of each gas-out part is smaller than the adhesive force of the by-products, so that the film formed by the by-products can be stabilized and does not fall off during the periodic self-cleaning function.

DETAILED DESCRIPTION OF THE INVENTION

Figure 2:
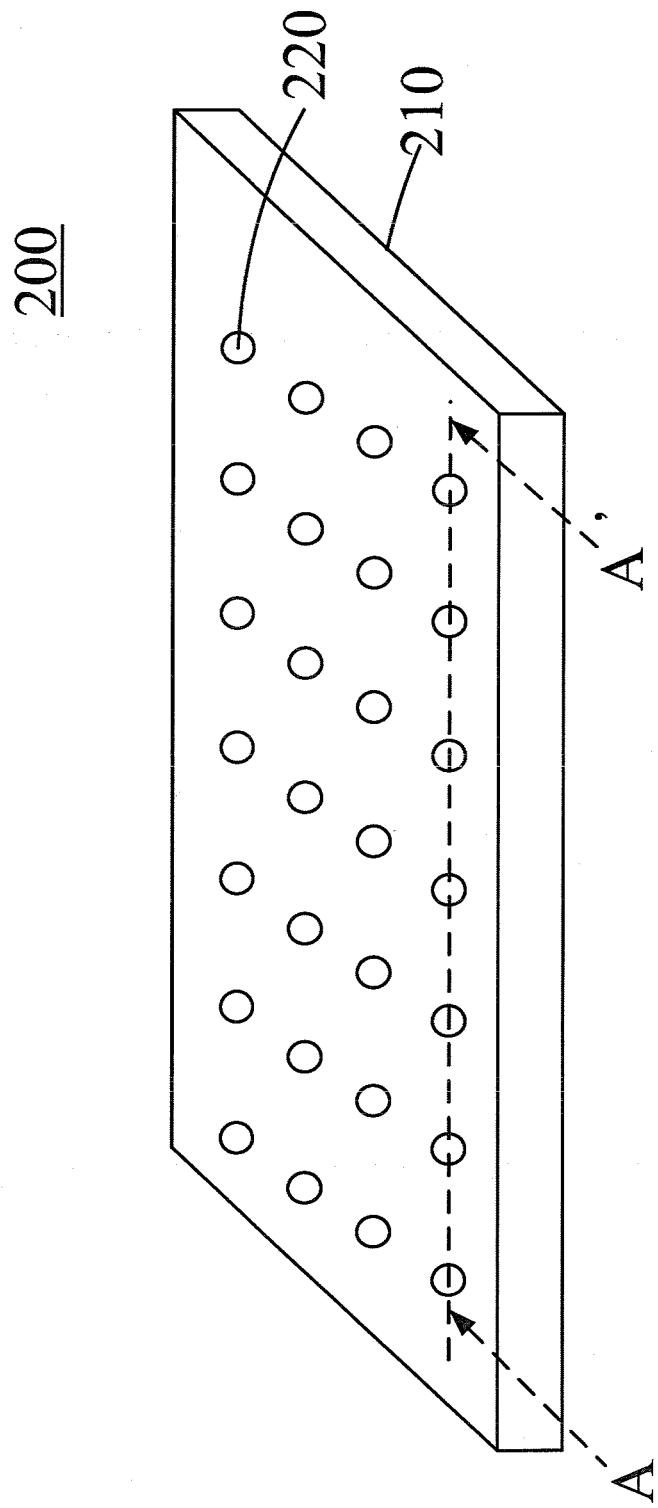
FIG. 2 illustrates a stereographic diagram of a diffuser structure 200 according to an embodiment of the present invention.
Figure 3:
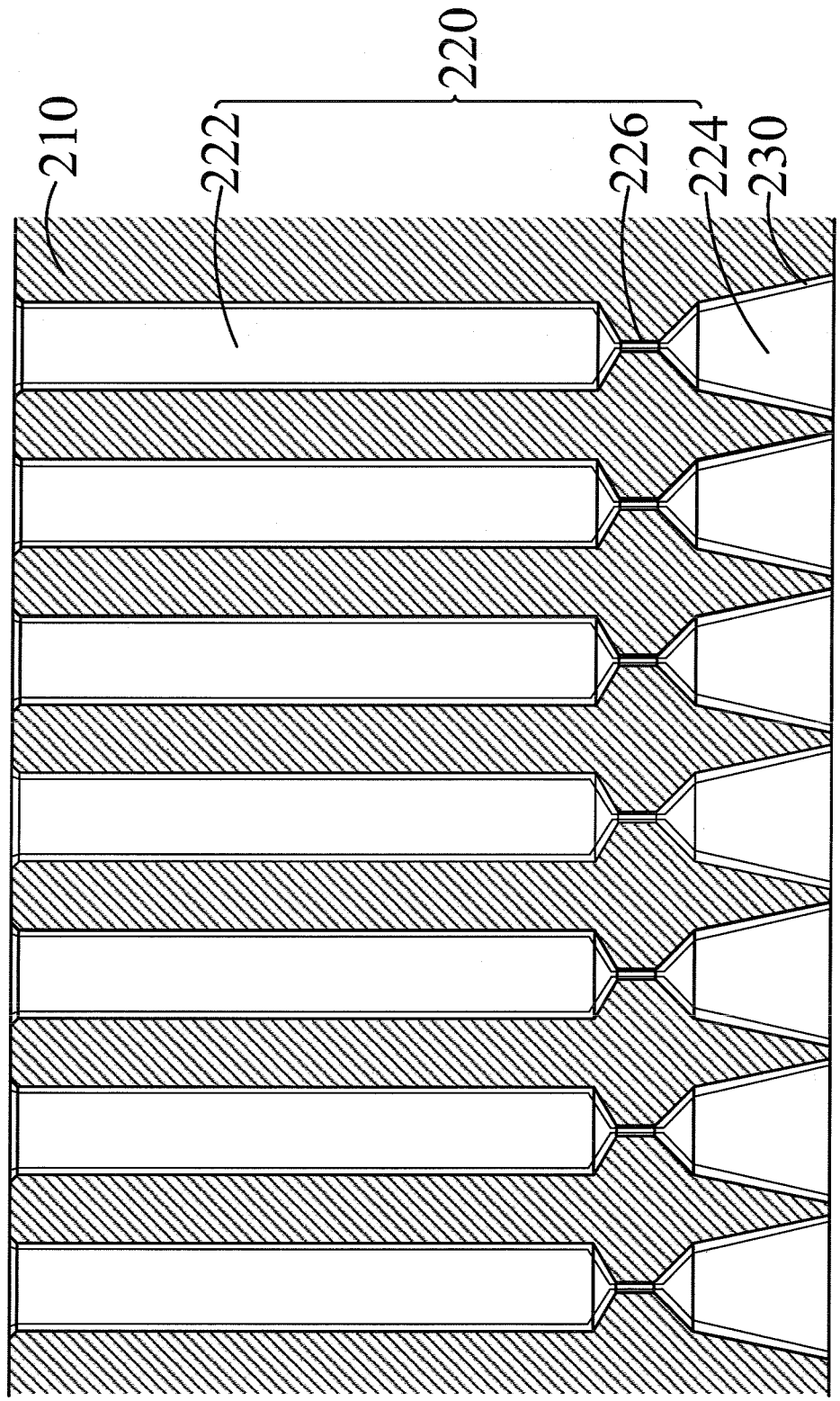
FIG. 3 illustrates a cross-sectional view along a line AA' in FIG. 2.
Figure 5:
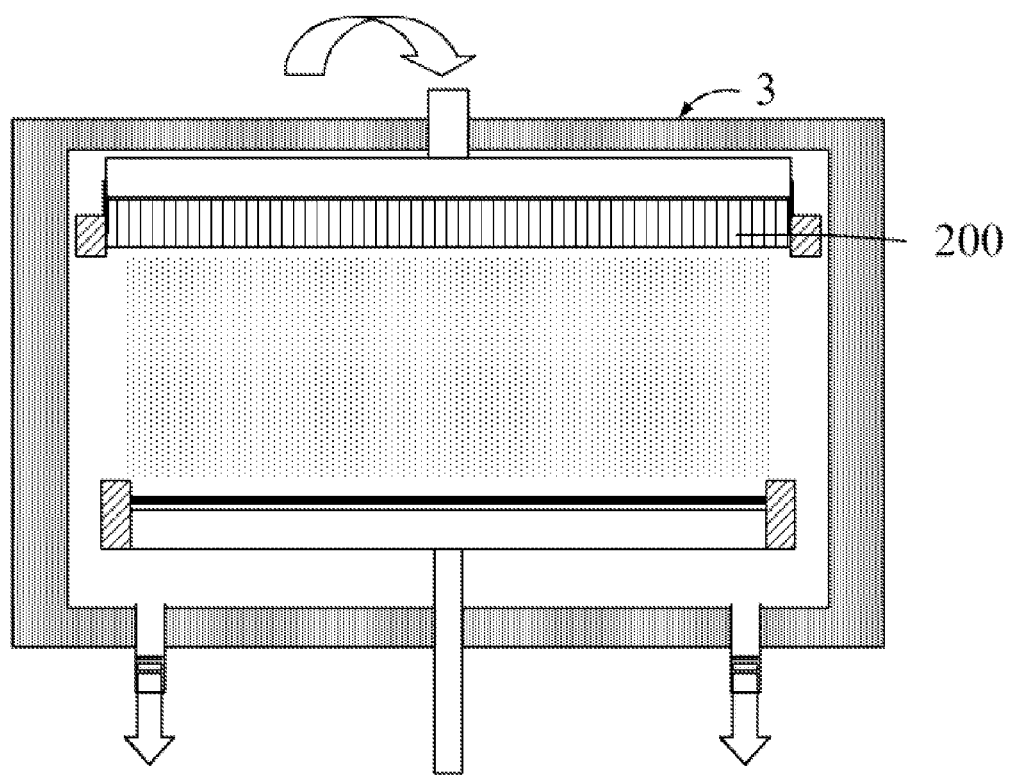
FIG. 5 illustrates that the diffuser structure is positioned in a plasma-enhanced chemical vapor deposition (PECVD) reaction chamber.

Please refer to FIG. 2 and FIG. 3. FIG. 2 illustrates a stereographic diagram of a diffuser structure 200 according to an embodiment of the present invention. FIG. 3 illustrates a cross-sectional view along a line AA' in FIG. 2. The diffuser structure 200 is positioned in a plasma-enhanced chemical vapor deposition (PECVD) reaction chamber 3 (as shown in FIG. 5) and comprises a substrate 210, a plurality of throughholes 220, and a glue layer 230. The throughholes 220 are formed perpendicularly in the substrate 210. That is, the throughholes 220 penetrate through the substrate 210 and appear both on an upper surface and a lower surface of the substrate 210. Each of the throughholes 220 comprises a gas-in part 222, a gas-out part 224, and a connecting part 226, respectively. The connecting part 226 is utilized for connecting the gas-in part 222 to the gas-out part 224. The glue layer 230 is formed on a side wall of each gas-out part 224.

The substrate 210 is generally made of metal, such as aluminum (Al), stainless steel, or titanium (Ti). A diameter of the connecting part 226 is about 0.4 millimeter (mm). The diameter of the connecting part 226 is smaller than a diameter of the gas-in part 222 and a diameter of the gas-out part 224.

Figure 1:
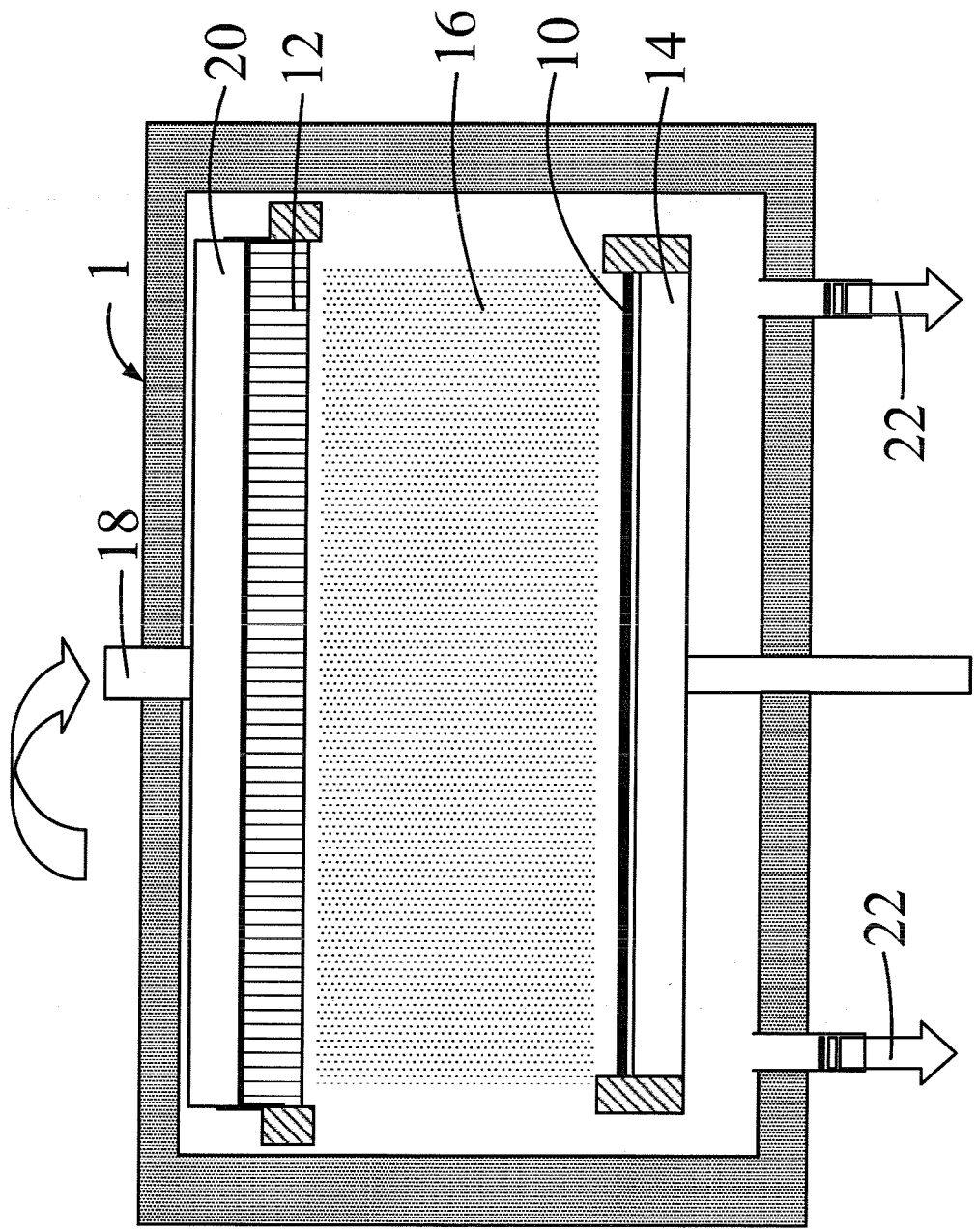
FIG. 1 illustrates the glass substrate in a plasma-enhanced chemical vapor deposition (PECVD) chamber.

The connecting part 226 is utilized for limiting the flow rate of the reaction gas. The gas-in part 222 is utilized as the reaction gas inlet for a process such as a plasma-enhanced chemical vapor deposition (PECVD). The gas-in part 222 is approximately cone-shaped. A narrower end (top) of the gas-in part 222 is connected to the connecting part 226. The gas-out part 224 is utilized as a reaction gas outlet for the PECVD process. The gas-in part 222 is also approximately cone-shaped. A narrower end (top) of the gas-out part 224 is connected to the connecting part 226. The gas through the gas-out part 224 will be introduced into the reaction chamber 1 where is filled with the plasma 16 (shown in FIG. 1) during the PECVD process.

A thickness of the glue layer 230 is between 1 μm and 11 μm. In one embodiment, the thickness of the glue layer 230 is preferably between 1 μm and 3 μm. If the thickness of the glue layer 230 is larger than 11 μm, the glue layer 230 will have an insulating effect which is unfavorable to the PECVD process. In the present embodiment, the glue layer 230 is further formed on a side wall of each connecting part 226 and a side wall of each gas-in part 222. That is, the glue layer 230 is formed on the whole side surfaces of each throughhole 220. It is noted that the glue layer 230 may only be formed on the side wall of each gas-out part 224 but not on the side wall of each connecting part 226 and the side wall of each gas-in part 222. This is because each gas-out part 224 is near the plasma 16 (shown in FIG. 1), the gas required during the PECVD process reacts most actively near the gas-out part 224 and particles sourced by the by-products are possibly generated at each gas-out part 224. In conclusion, the glue layer 230 is at least formed on the side wall of each gas-out part 224 so as to improve the problem that the particles are generated periodically after a periodic self-cleaning function according to prior art.

Figure 4:
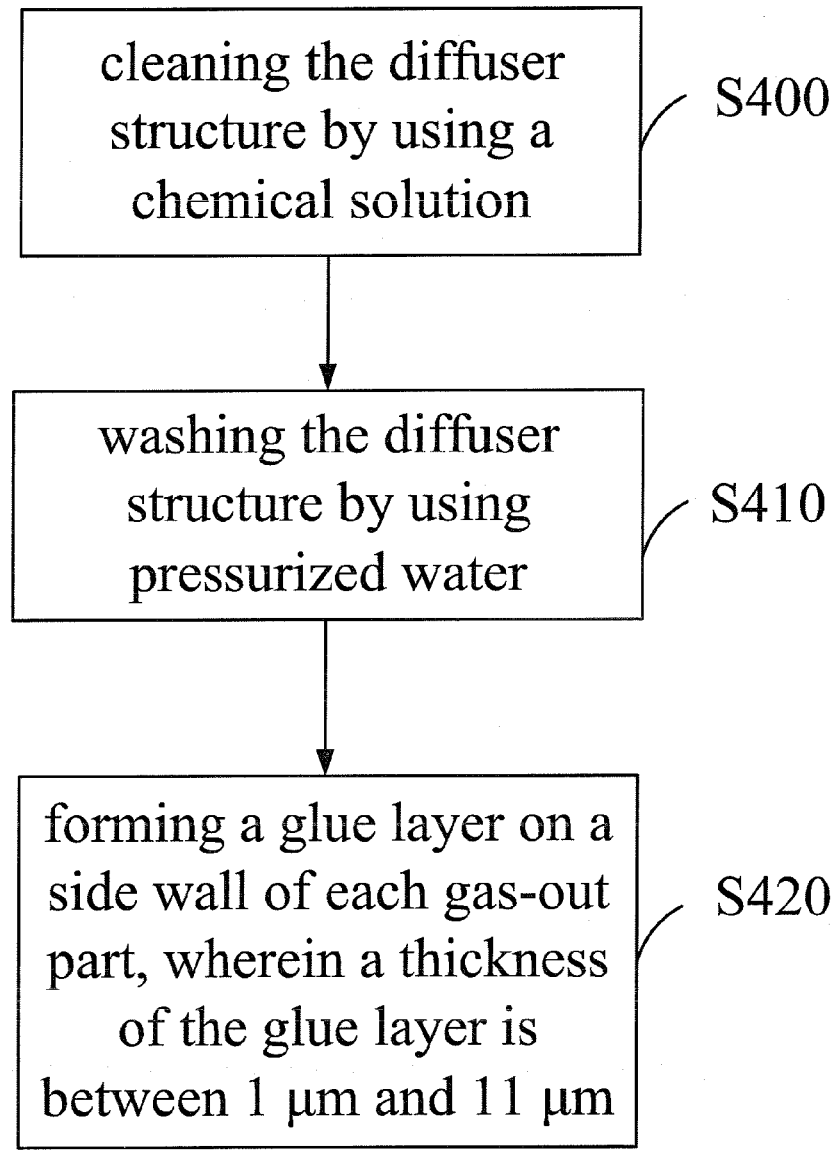
FIG. 4 illustrates a flow chart according to a manufacturing method of the diffuser structure.

Please refer to FIG. 2-FIG. 4. FIG. 4 illustrates a flow chart according to a manufacturing method of the diffuser structure 200. The diffuser structure 200 comprises the substrate 210 and the plurality of throughholes 220 formed perpendicularly in the substrate 210. Each of the throughholes 220 comprises the gas-in part 222, the gas-out part 224, and the connecting part 226 for connecting the gas-in part 222 to the gas-out part 224, respectively. The manufacturing method comprises the following steps.

In step S400, the diffuser structure 200 is cleaned with a chemical solution. For example, dirt adhered to surfaces of the diffuser structure 200 is dissolved and cleaned by using a nitric acid solution.

In step S410, the diffuser structure 200 is washed by using pressurized water.

In step S420, the glue layer 230 is formed on the side wall of each gas-out part 240. For example, the glue layer 230 is formed on the side wall of each gas-out part 240 by an anodization process with a sulfuric acid solution. Preferable conditions of the anodization process are described as the following: the concentration of the sulfuric acid solution is between about 15% to 25% weight percent (wt. %), and the temperature of the sulfuric acid solution is between −5 degree C. and 20 degree C. In condition that the substrate 210 is made of aluminum, oxygen molecules of the sulfuric acid solution will be combined with the aluminum after the anodization process. As a result, $Al_2O_3$ is formed on the side wall of each gas-out part 224. That is, the glue layer 230 is an oxide layer. According to repeated experiments by the inventors of the present invention, the thickness of the glue layer 230 is properly between 1 μm and 11 μm. In a preferred embodiment, the thickness of the glue layer 230 is between 1 μm and 3 μm. If the thickness of the glue layer 230 is larger than 11 μm, the glue layer 230 will have an insulating effect. The insulating effect is unfavorable to the PECVD process. Furthermore, the glue layer 230 can be formed by other proper chemical, physical or combined methods.

In the aforesaid step S420, the glue layer 230 is further formed on the side wall of each connecting part 226 and the side wall of each gas-in part 224.

In condition that the PECVD process for forming SiNx film on the glass substrate is illustrated for explanation, SiNx by-products is formed as a film on the substrate 210 and the SiNx film has a strong shrinkage stress. If the shrinkage stress is greater than an adhesive force between the SiNx film and the surface of the substrate, the SiNx film will be peeled and therefore become particles source. The glue layer of the present invention is formed between the side wall of the gas-out part and the SiNx film so as to decrease the shrinkage stress of SiNx film on the gas-out part. Consequently, the shrinkage stress of SiNx film during the film forming moments can be smaller than the adhesive force between the SiNx film and the surface of the substrate. The SiNx film can be stably formed and does not drop off during the periodic self-cleaning function.

Regarding the other by-products originated by various processes, the manner of film forming and characteristics of the film are similar to the SiNx film as aforementioned. Similarly, the problem that the particles are periodically generated after the periodic self-cleaning function also can be improved by forming the glue layer of the present invention.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A diffuser structure, positioned in a plasma-enhanced chemical vapor deposition reaction chamber, the diffuser structure comprising:
    a substrate;
    a plurality of throughholes, formed perpendicularly in the substrate, each of the throughholes comprising:
        a gas-in part;
        a gas-out part; and
        a connecting part, for connecting the gas-in part to the gas-out part; and
    an anodized glue layer, formed on a side wall of each gas-out part, wherein a thickness of the anodized glue layer is between 1 μm and 11 μm.

2. The diffuser structure of claim 1, wherein the substrate is made of metal.

3. The diffuser structure of claim 2, wherein the substrate is made of aluminum.

4. The diffuser structure of claim 1, wherein the gas-in part is approximately cone-shaped.

5. The diffuser structure of claim 1, wherein the gas-out part is approximately cone-shaped.

6. The diffuser structure of claim 1, wherein the thickness of the anodized glue layer is between 1 μm and 3 μm.

7. The diffuser structure of claim 1, wherein the anodized glue layer is an oxide layer.

8. The diffuser structure of claim 1, wherein the anodized glue layer is further formed on a side wall of each connecting part.

9. The diffuser structure of claim 8, wherein the anodized glue layer is further formed on a side wall of each gas-in part.

10. The diffuser structure of claim 1, wherein a diameter of the connecting part is smaller than a diameter of the gas-in part and a diameter of the gas-out part.

11. A manufacturing method of a diffuser structure, the diffuser structure comprising a substrate and a plurality of throughholes formed perpendicularly in the substrate, each of the throughholes comprising a gas-in part, a gas-out part, and a connecting part for connecting the gas-in part and the gas-out part, the manufacturing method comprising steps of:
    cleaning the diffuser structure by using a chemical solution; and
    forming a glue layer on a side wall of each gas-out part, wherein a thickness of the glue layer is between 1 μm and 11 μm.

12. The manufacturing method of the diffuser structure of claim 11, further comprising a step of washing the diffuser structure by using pressurized water before the step of forming the glue layer on the side wall of each gas-out part.

13. The manufacturing method of the diffuser structure of claim 11, wherein the chemical solution is a nitric acid solution.

14. The manufacturing method of the diffuser structure of claim 11, wherein the glue layer is formed on the side wall of each gas-out part by an anodization process with a sulfuric acid solution.

15. The manufacturing method of the diffuser structure of claim 14, wherein a concentration of the sulfuric acid solution is between about 15 and 25 weight percent.

16. The manufacturing method of the diffuser structure of claim 14, wherein a temperature of the sulfuric acid solution is between −5 degree C. and 20 degree C.

17. The manufacturing method of the diffuser structure of claim 11, wherein the thickness of the glue layer is between 1 μm and 3 μm.

18. The manufacturing method of the diffuser structure of claim 11, wherein the substrate is made of metal.

19. The manufacturing method of the diffuser structure of claim 18, wherein the substrate is made of aluminum.

20. The manufacturing method of the diffuser structure of claim 11, wherein the glue layer is an oxide layer.

21. The manufacturing method of the diffuser structure of claim 11, further comprising a step of forming the glue layer on a side wall of each connecting part in the step of forming the glue layer on the side wall of each gas-out part.

22. The manufacturing method of the diffuser structure of claim 11, further comprising a step of forming the glue layer on a side wall of each gas-in part in the step of forming the glue layer on the side wall of each gas-out part.

* * * * *